United States Patent [19]
Kyogoku

[11] Patent Number: 4,753,504
[45] Date of Patent: Jun. 28, 1988

[54] MIRROR STRUCTURE FOR LASER PRINTER

[75] Inventor: Tetsuo Kyogoku, Toyokawa, Japan

[73] Assignee: Minolta Camera Kabushiki Kaisha, Osaka, Japan

[21] Appl. No.: 759,603

[22] Filed: Jul. 26, 1985

[30] Foreign Application Priority Data

Jul. 27, 1984 [JP] Japan ................. 59-158454

[51] Int. Cl.⁴ .......................... G02B 26/10; G02B 5/08
[52] U.S. Cl. ....................................... 350/6.8; 350/6.5; 350/641; 423/439; 427/295
[58] Field of Search ................ 350/1.1, 1.7, 1.6, 6.5, 350/6.7, 6.8, 612, 613, 641; 264/131, 194; 423/439; 427/295, 296

[56] References Cited

U.S. PATENT DOCUMENTS

| | | | |
|---|---|---|---|
| 2,962,388 | 11/1960 | Ruppert et al. | 427/295 |
| 3,959,557 | 5/1976 | Berry | 427/295 |
| 3,979,500 | 9/1976 | Sheppard et al. | 423/439 |
| 4,355,859 | 10/1982 | Herloski et al. | 350/ |
| 4,390,235 | 6/1983 | Minoura | 350/ |
| 4,448,855 | 5/1984 | Senaha et al. | 427/295 |
| 4,568,140 | 2/1986 | van der Werf et al. | 350/1.6 |

Primary Examiner—John K. Corbin
Assistant Examiner—Loha Ben
Attorney, Agent, or Firm—Price, Gess & Ubell

[57] ABSTRACT

There is disclosed a mirror structure for laser printers which exhibits a high reflectance in the near infrared wavelength region, has high durability and is easy to fabricate. The mirror structure has a reflection layer formed on a substrate and comprising titanium nitride or a mixture of titanium nitride and titanium carbide.

10 Claims, 2 Drawing Sheets

FIG.3
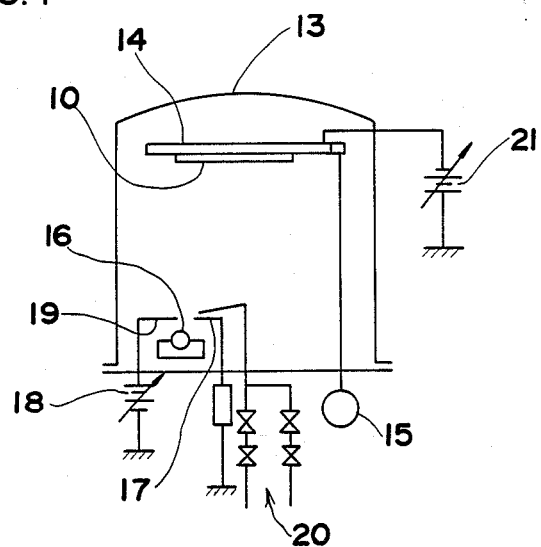
FIG.4
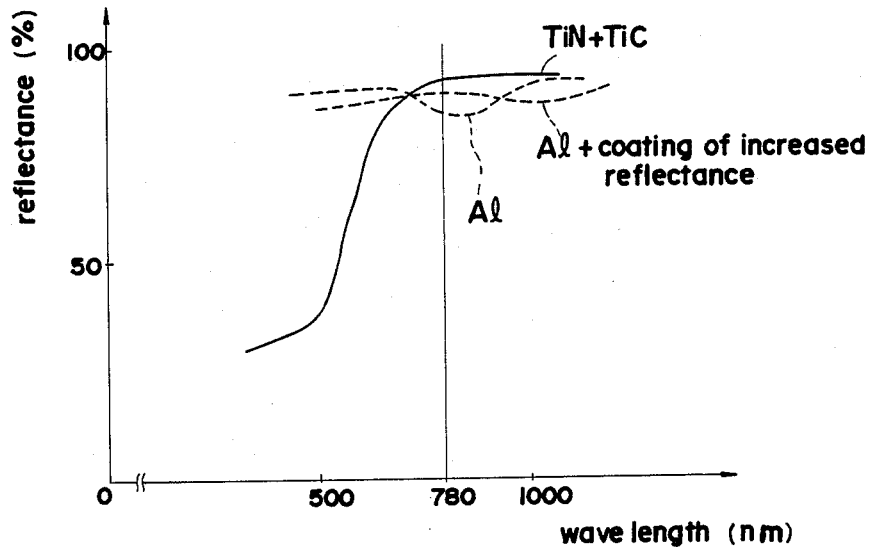
FIG.5

MIRROR STRUCTURE FOR LASER PRINTER

FIELD OF THE INVENTION

The present invention relates to a mirror structure for use in laser printers, and more particularly to a mirror structure suitable for laser printers in which a semiconductor laser is used.

BACKGROUND OF THE INVENTION

The laser printer is used as a high-speed terminal device or the like for printing out an output of a computer. FIG. 1 shows an example of optical system of the laser printer. With reference to FIG. 1, the light emitted by a semiconductor laser 1 is collimated by a collimator lens 2 into a beam of parallel rays incident on a polygonal mirror 3. Semiconductor lasers, which are of small size, have been introduced into use in recent years in place of He-Ne gas lasers and the like and are generally about 780 nm in the oscillation wavelength.

The polygonal mirror 3 is rotated at a high speed by an unillustrated motor. The beam reflected from the mirror 3 is subjected to scanning by the rotation and impinges on a photosensitive drum 6 via an image forming lens 4 and a mirror 5. Because the semiconductor laser 1 is turned on and off in response to an output from the computer, an image of electric charges is formed on the drum 6 in conformity with the on-off action of the laser 1. The charge image on the drum 6 is treated by a known electrophotographic process.

The characteristics required of the mirror for use in such laser printers are high reflectance, high durability and ease of fabrication.

The high reflectance reduces the optical loss to be involved in the optical system, permitting use of a laser of lower output and leading to a cost reduction. The reflectance must be sufficiently high in the near infrared wavelength region which includes the oscillation wavelength of the laser, i.e. about 780 nm in the case of the semiconductor laser.

With laser printers, the dust adhering to the surfaces of the mirrors, especially to the surface of the polygonal mirror, produces an appreciable influence on the copy images, so that there arises a need to clean the mirror surface. In this respect, the durability of the mirror is of importance.

An ease of mirror fabrication of course would provide greater economy.

The mirrors heretofore used for laser printers are commonly those prepared by depositing Al on a substrate by vacuum evaporation, because Al mirrors are generally superior in reflectance, durability and ease of fabrication.

When compared only in reflectance, Au, Cu and Ag have a higher reflectance, but Au exhibits poor adhesion on vacuum evaporation and is low in durability. Cu and Ag undergo a marked change with time due to oxidation or the like.

FIG. 2, showing the reflectance-wavelength characteristics of Al, reveals that this metal has a decreased reflectance at about 780 nm which is the oscillation wavelength of the semiconductor laser. FIG. 2 also shows the reflectance characteristics of Au and Cu which are superior to Al in reflectance. Al is approximately 15% lower than Au and Cu in reflectance at around 780 nm.

It will therefore be understood that although satisfactory in various characteristics requirements on the average, the Al mirror is slightly inferior in reflectance for use with semiconductor lasers.

As a method of giving an improved reflectance to Al mirrors, it appears useful to coat the Al mirror with a reflection increasing film. Since this film is designed to afford an increased reflectance by film-with-film interference, the film must be formed with an accurately controlled thickness. When the polygonal mirror for laser printers is to be coated with a reflection increasing film, extreme difficulties ar encountered in forming a thin film of uniform thickness on each side of the mirror which is in the form of a polygonal prism.

SUMMARY OF THE INVENTION

Accordingly, the main object of the present invention is to provide a mirror structure for laser printers which exhibits a high reflectance in the near infrared wavelength region, has high durability and is easy to fabricate.

Another object of the present invention is to provide a mirror structure suitable for laser printers wherein a semiconductor laser is used.

These and other objects of the present invention can be fulfilled by a mirror structure which includes a reflection layer formed on a substrate and comprising titanium nitride or a mixture of titanium nitride and titanium carbide.

BRIEF DESCRIPTION OF THE DRAWINGS

These and other objects or features of the present invention will become apparent from the following description of a preferred embodiment thereof in conjunction with the accompanying drawings, in which:

FIG. 3 is a diagram in section showing a mirror structure according to the present invention;

FIG. 4 is a diagram showing an ion plating apparatus for use in forming the mirror structure of the invention; and FIG. 5 is a graph showing the reflectance characteristics of the mirror structure of the invention in comparison with those of Al and also of Al coated with a reflection increasing film.

DETAILED DESCRIPTION OF THE INVENTION

Figure 1:
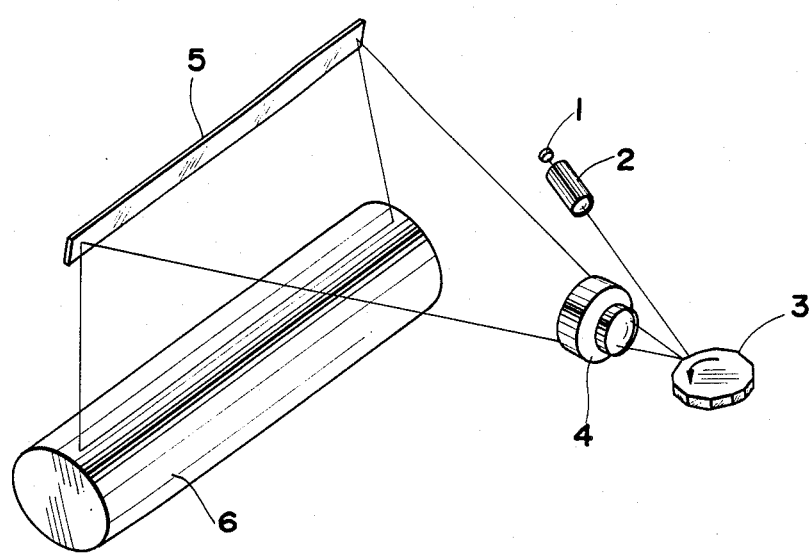
FIG. 1 is a diagram showing the optical system of a laser printer.
Figure 2:
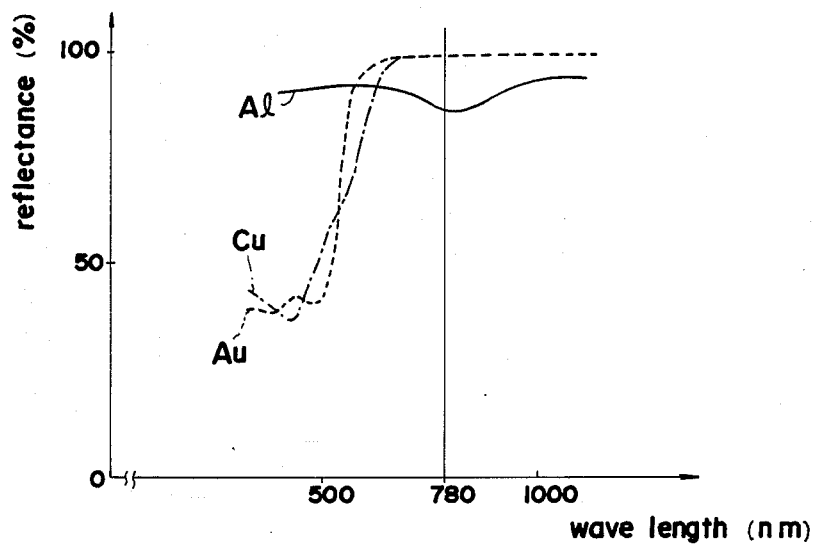
FIG. 2 is a graph showing the reflectance characteristics of Al in comparison with those of Cu and Au.

The mirror structure of the present invention is used, for example, for the polygonal mirror 3 or the plane mirror 5 for folding the optical path in FIG. 1. The present mirror structure is of course usable for the mirrors included in the optical system of a laser printer of other construction. Since the mirror structure of the present invention is adapted to give a sufficiently high reflectance in a long wavelength region including 780 nm, the structure is usable also for light sources, other than semiconductor lasers, which produce light of that wavelength region.

FIG. 3 shows a mirror structure embodying the present invention. The mirror structure comprises a substrate 10 and a reflection layer 11. The reflection layer 11 is formed of TiN or a mixture of TiN and TiC. When made only of TiN, the reflection layer 11 also exhibits a higher reflectance than Al mirrors, while the addition of a small amount of TiC to TiN affords a still higher reflectance. TiC, if singularly used, fails to give a high reflectance.

The reflection layer 11 is formed by vacuum evaporation, and especially an ion plating process or reactive sputtering process.

The ion plating process is conducted by evaporating Ti in a vacuum chamber by resistance heating or irradiation with an electron beam, and ionizing the Ti by discharge due to a d.c. electric field or high-frequency electric field to cause the ionized Ti to chemically react with $N_2$ or $NH_3$ gas already introduced into the chamber and to deposit the product, namely TiN, on a substrate. TiC is deposited similarly using $C_2H_2$ gas in place of $N_2$ or $NH_3$ Reactive sputtering is carried out in the same manner as common cathode sputtering by introducing a reactant gas into a discharge gas. In the present case, Ti is used as the sputtering electrode, and the reactant gas is $N_2$ or $NH_3$ for TiN, or is $C_2H_2$ or the like for TiC.

Although either process is usable for the present invention, the ion plating process provides a product of slightly higher reflectance.

The substrate 10 can be made of a metal such as stainless steel or Al, an inorganic material such as glass, or a resin material such as acrylic, styrol in lieu thereof allyl or polycarbonate. The material for the substrate is determined according to the characteristics of the mirror to be obtained. For example, metal materials are durable and amenable to high-precision surface machining, but costly, and therefore suited to polygonal mirrors for high-speed rotation. Glass premitting high-precision surface machining, is relatively less costly, but is prone to cracking during high-speed rotation, so that it is suitable for polygonal mirrors for low-speed rotation. Resin materials, which are easy to mold but low in surface precision, are suited to mirrors, for example, for folding the optical path.

An example is given below wherein a mirror structure was fabricated with a reflection layer formed from a mixture of TiN and TiC by the ion plating process. FIG. 4 schematically shows the apparatus used for the process. Indicated at 13 is a vacuum container, in which a specimen mount table 14 for retaining a substrate 10 on its lower side is rotatable in a horizontal plane by being driven from outside by a motor 15. A crucible 16 for evaporating Ti placed therein is heated by the impact of an electron beam from an electron gun 17. The electron gun 17 gave an output of 2.4 KW at an accelerating voltage of 8 KV and beam current of 300 mA. Indicated at 18 is an ionizing voltage source. It was found suitable to set the potential gradient between the crucible 16 and the ionizing electrode 19 to about 30 V/cm. Indicated at 20 is a gas supply system, and at 21 a voltage source for the ion accelerating voltage to be applied across the Ti source 16 and the substrate 10 serving as a negative electrode.

Stainless steel was used for the substrate 10. The vacuum container 13 was first evacuated to a high vacuum of $1 \times 10^{-5}$ torr (by an unillustrated system), and $N_2$ gas and $C_2H_2$ gas were introduced into the container to a vacuum of about $3-7 \times 10^{-4}$ torr. The $N_2$ to $C_2H_2$ gas ratio was 1:0.03 by volume. A voltage of $-200$ V was given to the stainless steel substrate 10.

FIG. 5 shows the reflectance characteristics of the TiN-TiC mixture prepared by the above process, in comparison with those of Al alone and of Al formed with a reflection increasing coat. The mirror according to the invention has at about 780 nm a reflectance of 88 to 95% which is comparable or superior to that of the coated Al.

The reflection layer 11 thus formed has a hardness of at least 1000 in terms of micro-Vickers hardness Hv ($kg/mm^2$) and is outstanding in durability. The reflection layer is easy to form because there is no need to strictly control its thickness unlike the reflection increasing film.

In the fabrication example described above, the gas for forming TiN and the gas for TiC were supplied at the same time, with the result that the reflection layer 11 obtained was in the form of a completely homogeneous mixture of TiN and TiC. On the other hand, when the gas for TiN and the gas for TiC are supplied separately, the reflection layer 11 obtained has a double-layer structure in which a TiC layer is formed over a TiN layer. The term "mixture" is herein used as including such a double- or multi-layer structure providing the reflection layer.

What is claimed is:

1. A mirror structure having a high reflectance in the near infrared wavelength region which comprises:
   a substrate, and
   a reflection layer formed on the substrate by a vacuum evaporation and including a mixture of titanium nitride and titanium carbide.

2. A mirror structure as claimed in claim 1, wherein the reflection layer is formed by an ion plating process or reactive sputtering process.

3. A mirror structure as claimed in claim 1, wherein the reflection layer is formed by an ion plating process in which $N_2$ gas and $C_2H_2$ gas are introduced into a container for evaporating Ti and the $N_2$ to $C_2H_2$ gas ratio is about 1:0.03 by volume.

4. A mirror structure as claimed in claim 1, wherein the substrate is any of a metal, a glass and a resin material.

5. A mirror structure for use in a polygonal mirror or a mirror for folding an optical path in a laser printer or the like and for reflecting a light in the near infrared wavelength region, said mirror structure comprising:
   a substrate, and
   a reflection layer formed on the substrate by vacuum evaporation and including a mixture of titanium nitride and titanium carbide.

6. A mirror structure as claimed in claim 5, wherein the reflection layer is formed by an ion plating process or reactive sputtering process.

7. A mirror structure as claimed in claim 5, wherein the substrate is any of a metal, a glass and a resin material.

8. In an improved laser printer having a semiconductor laser unit capable of emitting, in the near infrared range of wavelengths, a laser beam for reflection onto a photoconductive surface to provide a scanning arrangement, the improvement compromising:
   a mirror structure, mounted in the laser printer to reflect the scanning laser beam, and having a characteristic of a high degree of reflectance for near infrared wavelengths with a reflecting surface consisting of a mixture of titanium nitride and titanium carbide.

9. The laser printer of claim 8 wherein the reflecting surface has a characteristic surface of a type formed by an ion plating process wherein $N_2$ gas and $C_2H_2$ gas are introduced into a chamber for evaporating Ti and the $N_2$ to $C_2H_2$ gas ratio is about 1:0.03 by volume.

10. A method of forming a titanium nitride and titanium carbide mirror structure for an infrared laser printer comprising:

providing a vacuum chamber;

placing a substrate in the vacuum chamber;

reducing the atmospheric pressure to a high vacuum;

introducing a reactant gas containing nitrogen into the vacuum chamber;

evaporating and ionizing titanium in the vacuum chamber to deposit TiN on the substrate;

introducing a reactant gas containing carbon into the vacuum chamber, and evaporating and ionizing titanium in the vacuum chamber to deposit TiC on the substrate whereby an improved reflecting surface, to wavelengths of approximately 780 nm and above, containing titanium nitride and titanium carbide, is provided.

* * * * *